United States Patent
Jones

(12) 
(10) Patent No.: US 6,653,908 B1
(45) Date of Patent: Nov. 25, 2003

(54) OSCILLATOR CIRCUIT WITH AUTOMATIC LEVEL CONTROL FOR SELECTIVELY MINIMIZING PHASE NOISE

(75) Inventor: Mark Alan Jones, Tucson, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 158 days.

(21) Appl. No.: 09/982,762

(22) Filed: Oct. 18, 2001

(51) Int. Cl.$^7$ .................................................. H03B 5/00

(52) U.S. Cl. ........................ 331/183; 331/182; 331/185; 331/177 V; 331/74

(58) Field of Search ............................... 331/182, 183, 331/185, 175, 36, 74, 177 V

(56) References Cited

U.S. PATENT DOCUMENTS 6,064,277 A * 5/2000 Gilbert ........................ 331/109

* cited by examiner

*Primary Examiner*—Arnold Kinkead
(74) *Attorney, Agent, or Firm*—Vedder, Price, Kaufman & Kammholz, P.C.

(57) ABSTRACT

An oscillator with oscillator and voltage control circuitry for generating an oscillation signal having an amplitude that is automatically controlled for a selectively minimized phase noise. Automatic level control is used for controlling the amplitude of the oscillation signal such that the phase noise of the oscillation signal can be maintained at some selected level, e.g., minimized. The minimum signal voltage appearing across the oscillation circuit is monitored for controlling the bias of the circuit to prevent it from entering a saturation state, thereby avoiding adverse loading effects responsible for degraded phase noise performance.

20 Claims, 5 Drawing Sheets

OSCILLATOR CIRCUIT WITH AUTOMATIC LEVEL CONTROL FOR SELECTIVELY MINIMIZING PHASE NOISE

BACKGROUND OF THE INVENTION

1. Field of the Invention

The present invention relates to oscillator circuits, such as voltage controlled oscillator (VCO) circuits, and in particular, oscillator circuits having automatic level control for controlling the amplitude of the oscillator output signal so as to control the amount of phase noise within such signal.

2. Description of the Related Art

In oscillator circuit design, particularly when designing VCO circuits for use in a phase lock loop (PLL), a key design parameter is that of the phase noise performance of the oscillator. As is well known in the art, the term phase noise is generally used for describing short term, random frequency fluctuations of a signal, such as that generated by an oscillator. The frequency stability of the oscillator circuit is a measure of the degree to which the oscillator maintains the same value of output signal frequency over a given interval of time. The ideal output signal from a sine wave oscillator is generally described as:

$$V(t) = V_o * \sin(2\pi f t)$$

where: V(t)=oscillator output signal

Vo=nominal amplitude of oscillator output signal f=frequency in Hertz (Hz)

t=time in seconds while the instantaneous output signal of the oscillator is generally represented by:

$$V(t) = V_o * \{1 + A(t)\} * \sin\{2\pi f t + \Delta\phi(t)\}$$

where: A(t)=normalized amplitude fluctuations of oscillator output signal $\Delta\phi(t)$=phase fluctuations of oscillator output signal in radians Amplitude fluctuations in an oscillator signal can be removed, at least partially, by using a limiting amplifier. However, the phase noise of such a signal cannot be filtered out by any conventional means, and must be minimized at the point of generation. The magnitude of an oscillator's phase noise close in to the carrier can be expressed by Leeson's equation, as follows:

$$L(\Delta\omega) = 10 * \log[2FkT/P\text{sig} * (\omega_o/2Q\Delta\omega)^2]$$

where: $L(\Delta\omega)$=phase noise power spectral density of the oscillator in dBc/Hz F=equivalent noise factor of the negative R cell Psig=signal power in the oscillator $\omega_o$=center frequency of the oscillator Q=loaded Q (quality factor) of the oscillator tank $\Delta\omega$=frequency offset from the center frequency k=Boltzmann's constant T=temperature in Kelvin As predicted by Leeson's equation, phase noise can be reduced by increasing oscillation amplitude. Since Psig is proportional to $V_o^2$, the phase noise decreases by a factor of 4 each time the oscillation voltage is doubled. However, most oscillators operate in a state of saturation. As a result, simply increasing the output signal level will cause adverse loading effects, such as those from increased base currents flowing through the bipolar transistors used for generating the output signal. These loading effects manifest themselves as a dramatic reduction in loaded Q of the tank circuit, degrading phase noise per the equation above.

The phase noise of the oscillator is often one of the more significant limiting factors in the performance capabilities of the host system, such as the ability of a radio receiver to reject undesired signals and preserve modulation fidelity of the frequency down converted signals. For example, in a radio transceiver, poor oscillator phase noise can lead to undesirable noise transmissions outside the desired bandwidth of the channel being transmitted. Hence, the phase noise of the oscillator circuit is one of the primary figures of merit used to determine the performance of the overall system.

Several factors play a role in the phase noise performance of the oscillator. The quality factor ("Q") of the resonator, the noise factor of the negative impedance cell and the oscillation signal amplitude all affect the phase noise of the oscillator, as shown in Leeson's equation.

One conventional technique that has been used to address the effect of the oscillation signal amplitude upon the phase noise performance is to introduce automatic level control for establishing the amplitude of the oscillation signal at the appropriate level needed for achieving the desired phase noise. Such conventional automatic level control techniques have involved the detection of the oscillation signal (e.g., in terms of peak, peak-to-peak or RMS voltage) and comparing such detected voltage to a fixed voltage reference.

However, such automatic level control techniques do not allow the circuit to maintain the desired amount of control over the phase noise throughout significant variations in circuit operating temperature, power supply voltages and fabrication processes used to produce such circuit. Accordingly, it would be desirable to have a form of automatic level control for an oscillator circuit to optimize the amplitude performance of the oscillator in such a manner as to provide consistent control over its phase noise performance, and to maintain such control not withstanding variations in circuit operating temperature, power supply voltages and fabrication processes.

SUMMARY OF THE INVENTION

An oscillator in accordance with the presently claimed invention generates an oscillation signal having an amplitude that is automatically controlled for a selectively minimized phase noise. Automatic level control is used for controlling the amplitude of the oscillation signal such that the phase noise of the oscillation signal can be minimized or maintained at some selected level.

In accordance with one embodiment of the presently claimed invention, an oscillator with an oscillation signal amplitude that is automatically controlled for a selectively minimized oscillation signal phase noise includes oscillator circuitry and voltage control circuitry. The oscillator circuitry including first and second circuit terminals and an active circuit portion coupled between the first and second circuit terminals, responsive to an amplitude control signal, generates an oscillator signal, wherein the first and second circuit terminals are at first and second DC bias potentials, respectively, and the first DC bias potential is higher than the second DC bias potential. The voltage control circuitry, coupled to the oscillator circuitry and responsive to a comparison of a minimum signal voltage at the first circuit terminal and a maximum signal voltage at the second circuit terminal, generates the amplitude control signal such that a difference between the minimum and maximum signal voltages is maintained at a predetermined voltage amplitude.

In accordance with another embodiment of the presently claimed invention, a method for generating an oscillation signal amplitude that is automatically controlled for a selected oscillation signal phase noise includes the steps of operating an active circuit between first and second circuit terminals, wherein the first and second circuit terminals are at first and second DC bias potentials, respectively, and the first DC bias potential is higher than the second DC bias potential;

receiving an amplitude control signal;

generating, in response to the amplitude control signal, an oscillator signal with a minimum signal voltage at the first circuit terminal and a maximum signal voltage at the second circuit terminal, wherein a difference between the minimum and maximum signal voltages is maintained at a predetermined voltage amplitude;

comparing the minimum and maximum signal voltages; and generating the amplitude control signal in response to the voltage comparison.

DETAILED DESCRIPTION OF THE INVENTION

Figure 1:
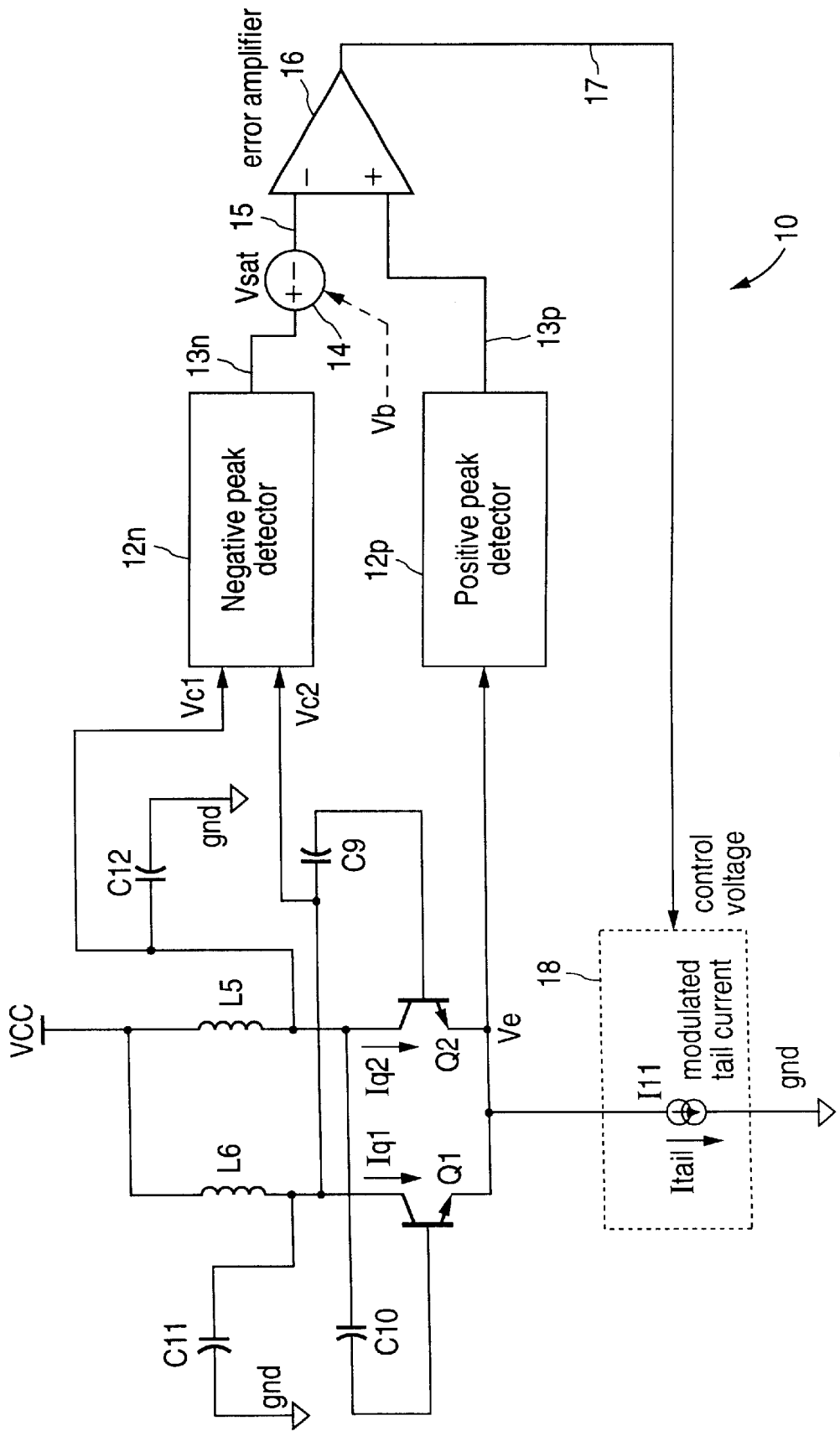
FIG. 1 is a schematic diagram of an oscillator circuit with automatic level control in accordance with one embodiment of the presently claimed invention.

Referring to FIG. 1, an oscillator circuit 10 in accordance with one embodiment of the presently claimed invention includes an oscillator circuit in the form of a differential amplifier implemented with NPN bipolar transistors Q1, Q2 cross coupled with capacitors C9, C10. The reactive load elements L5, L6, C11, C12 primarily determine the oscillation frequency of the circuit, while a current source 18 with a controllable current source circuit I11 provides the tail current Itail for the differential transistor pair Q1, Q2. (All elements are biased between power supply terminals VCC and circuit ground GND.)

The collector voltages Vc1, Vc2 of transistors Q1 and Q2 provide the oscillator output signal in the form of a differential output voltage Vc1–Vc2. These voltages, Vc1, Vc2 are each detected by a voltage detector 12n in the form of a negative peak detector (discussed in more detail below).

Similarly, the emitter voltage Ve present at the commonly connected emitter terminals of the transistors Q1, Q2 is detected by another voltage detector in the form of a positive peak detector 12p (discussed in more detail below).

The negative peak detector 12n detects the minimum collector voltage Vcmin for each of the transistor collector voltages Vc1, Vc2. Conversely, the positive peak detector 12p detects the maximum emitter voltage Vemax of the emitter voltage Ve at the commonly connected emitter terminals of the transistors Q1, Q2. The minimum detected collector voltage 13n is reduced by a voltage factor Vsat, generated by a voltage reference circuit 14. The resulting voltage 15 is compared to the maximum detected emitter voltage 13p in an error amplifier 16 (e.g., an operational amplifier integrator circuit) to produce a control voltage 17.

This control voltage 17 is an amplified version of the difference between the input voltages 15, 13p. Normally, the gain of the amplifier 16 is quite high such that the voltage difference between the two input terminals is driven to zero. It is this feedback operation that ensures that the following equations are satisfied:

$$Vcmin = Vemax + Vsat$$

$$Vcmin - Vemax = Vcemin = Vsat$$

where: Vcmin=minimum detected collector voltage

Vemax=maximum detected emitter voltage

Vsat=collector-emitter saturation voltage (e.g., 0.4 volt)

Vcemin=minimum collector-emitter voltage

Based upon the foregoing, it can be seen that, in accordance with the presently claimed invention, two voltage detectors are used to detect the minimum collector voltage Vcmin and maximum emitter voltage Vemax of the main oscillator device (or devices). This voltage difference is then effectively compared to a desired voltage difference, such as the saturation voltage Vsat of such oscillator device. Based upon this voltage comparison, a control voltage is used to ensure that the voltage difference between the minimum collector voltage Vcmin and maximum emitter voltage Vemax is maintained at an amplitude that corresponds to the voltage factor Vsat. For example, by maintaining this voltage difference equal to the saturation voltage of the main oscillator device, the phase noise within the oscillation signal will be minimized.

By controlling the minimum collector voltage(s) Vcmin and maximum emitter voltage Vemax, the control voltage 17 thereby controls the minimum collector-emitter voltage Vcemin across the transistors Q1, Q2. This is accomplished by controlling the tail current Itail. Hence, the control voltage 17 is used to control, or modulate, the current generator circuit I11 within the current source 18. By controlling the tail current Itail, the individual device currents Iq1, Iq2 through the transistors Q1, Q2 are controlled, thereby controlling the amplitudes of the collector Vc and emitter Ve voltages potentially available at the collector and emitter terminals, respectively, of the transistors Q1, Q2.

Based upon the foregoing discussion, it: should be readily appreciated that this type of oscillation circuit is capable of tracking variations in circuit power supply voltages, operating temperature and fabrication processes since two voltages generated within the circuit are constantly monitored and compared against one another. Hence, any changes in these voltages due to such power supply voltage, operating temperature or fabrication process variations will become self canceling.

As depicted in FIG. 1, the voltage reference circuit 14 may be controlled by some form of bias control signal Vb so as to allow th e amplitude of the voltage factor Vsat to be selectively adjusted. For example, depending upon a given application for the circuit 10, it. may be desirable to cause this voltage factor Vsat to be equal to some amplitude other than the saturation voltage of the oscillation transistors Q1, Q2.

Figure 2:
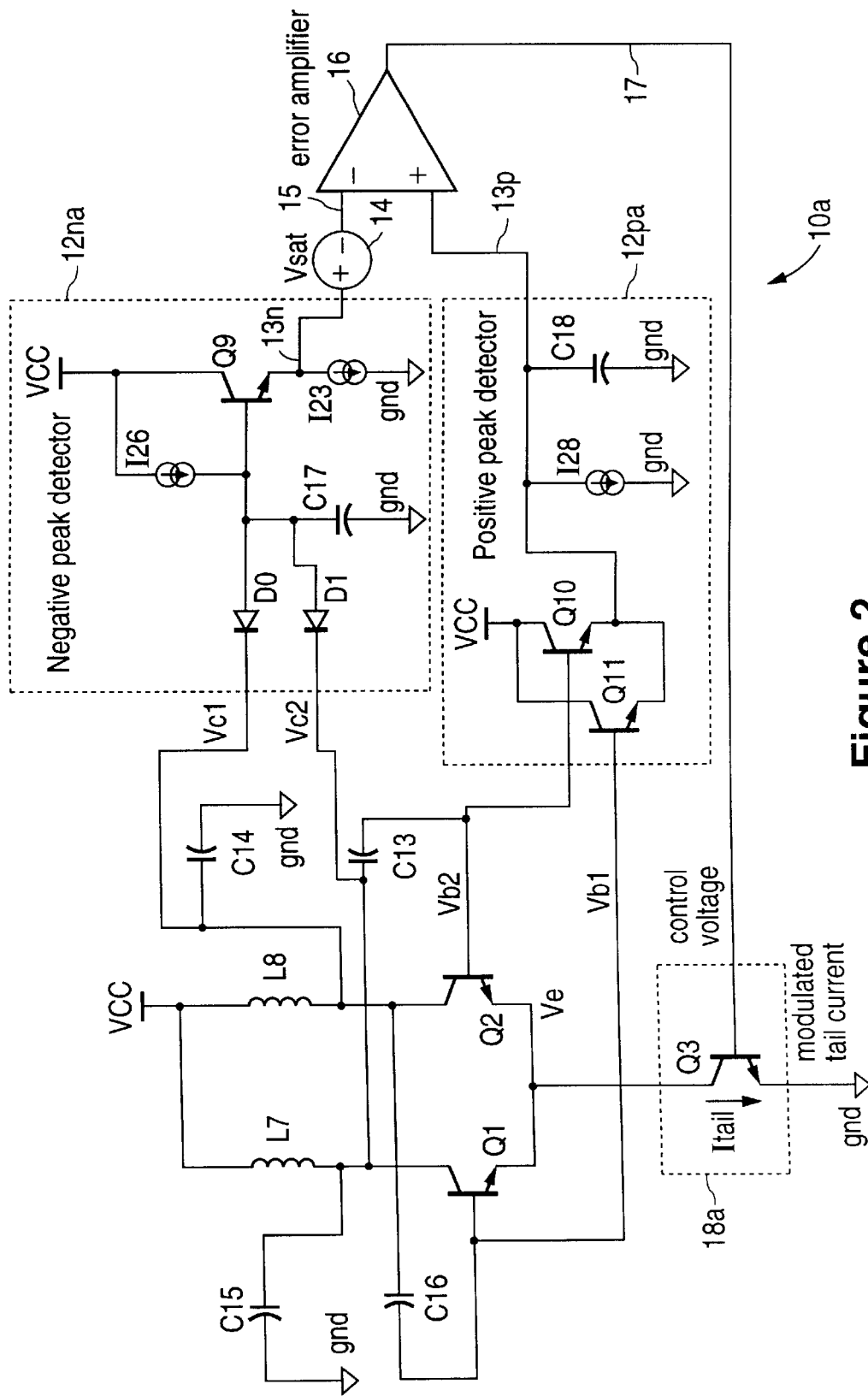
FIG. 2 is a schematic diagram of one example embodiment of the circuit of FIG. 1.

Referring to FIG. 2, one example embodiment 10a of the circuit 10 of FIG. 1 includes a negative peak detector circuit 12*na* and a positive peak detector circuit 12*pa* implemented as shown. In the negative peak detector circuit 12*na*, the minimum, or negative, signal peaks of the collector voltages Vc1, Vc2 are detected by the diodes D0, D1 and used to charge a shunt capacitor C17. The voltage across this capacitor C17 biases the base of a voltage follower transistor Q9, which is maintained in a normally on state by a base current source I26 and emitter current source I23. The emitter voltage of transistor Q9 forms the output signal 13*n* of the negative peak detector circuit 12*na* and is equal to the minimum, or most negative, peak voltage of the transistor collector voltages VC1, VC2 since the junction voltages of the diodes D0, D1 are in series and polarity opposition to the base-emitter voltage of transistor Q9.

In the positive peak detector circuit 12*pa*, the common emitter voltage Ve of the oscillation transistors Q1, Q2 is detected by detecting the corresponding base voltages Vb1, Vb2 which differ from the emitter voltage Ve by the well-known relationship of the base-emitter voltage Vbe of the transistors Q1, Q2. These base voltages Vb1, Vb2 are detected by the base-emitter junctions of transistors Q11 and Q10, respectively, to produce a combined detected voltage across the shunt current source I28 (used to bias transistors Q10 and Q11 in normally on states) and shunt capacitor C18. Shunt capacitor C18 provides a positive peak hold function, provided that the discharge time of the capacitor C18 through the current source I28 is much longer than one period of the oscillation signal. Hence, the voltage of the output signal 13*p* is equal to the maximum, or most positive, peak of the emitter voltage Ve due to the self-canceling effects of the serially connected and polarity opposed base-emitter voltages of the oscillator transistors Q1, Q2 and detector transistors Q11, Q10.

The current source 18*a* in this circuit 10*a* is implemented using NPN bipolar transistor Q3 as the current source circuit to generate the tail current Itail for the differential transistor pair Q1, Q2.

Figure 3:
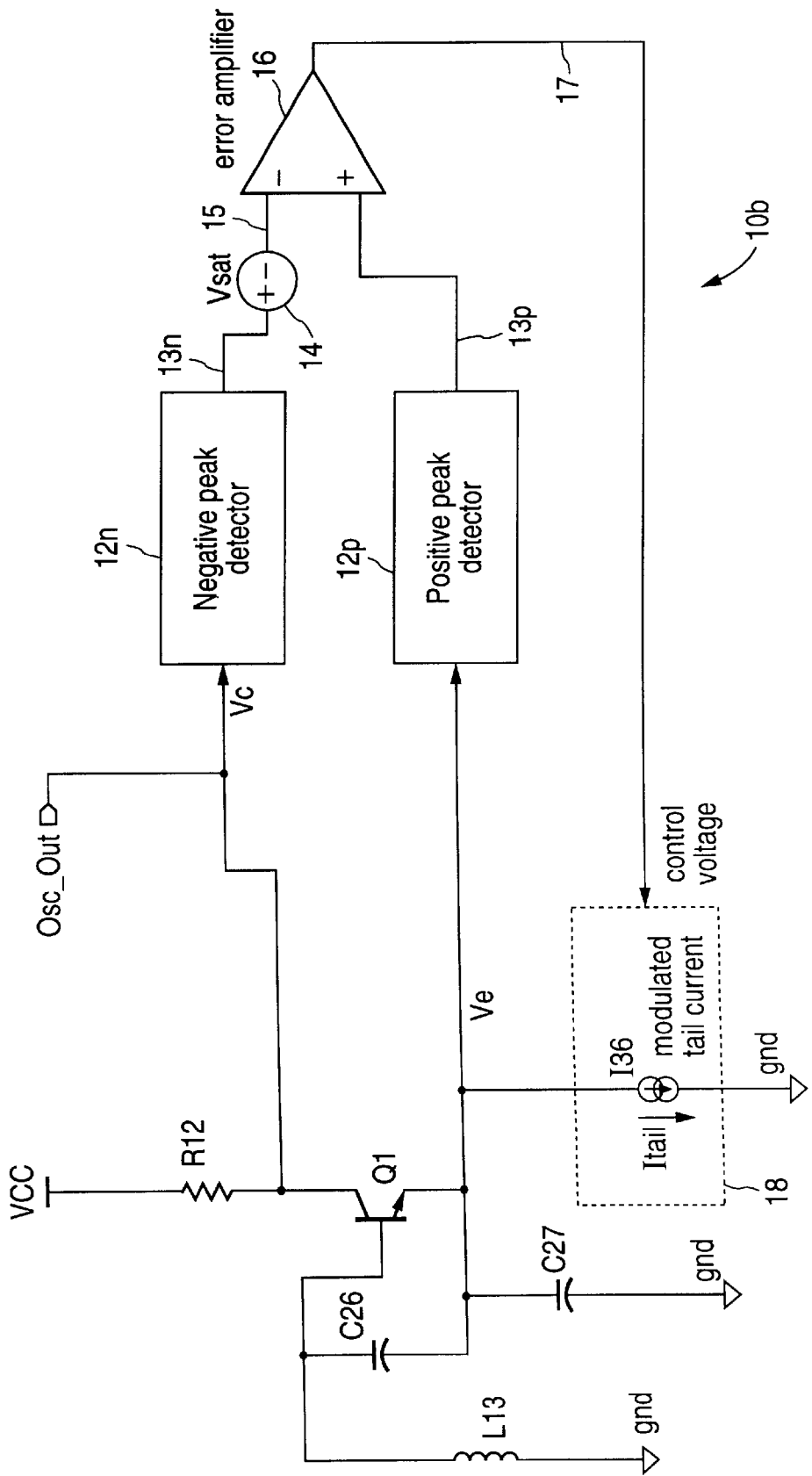
FIG. 3 is a schematic diagram of an oscillator with automatic level signal control in accordance with another embodiment of the presently claimed invention.

Referring to FIG. 3, an alternative embodiment 10*b* of an oscillator circuit in accordance with the presently claimed invention generates a non-differential, or single-ended, oscillator output signal. In this circuit 10*b*, a single oscillation transistor Q1 biased by a resistor R12 to the power supply VCC and the current source 18 to circuit ground GND, generates the oscillation signal Vc at its collector terminal, with the frequency determined by an inductor L13 and capacitors C26, C27. The operation and functionality of the remaining circuitry, including the detector circuits 12*n*, 12*p*, voltage reference circuit 14 and error amplifier circuit 16, are in accordance with the discussion above.

Figure 4:
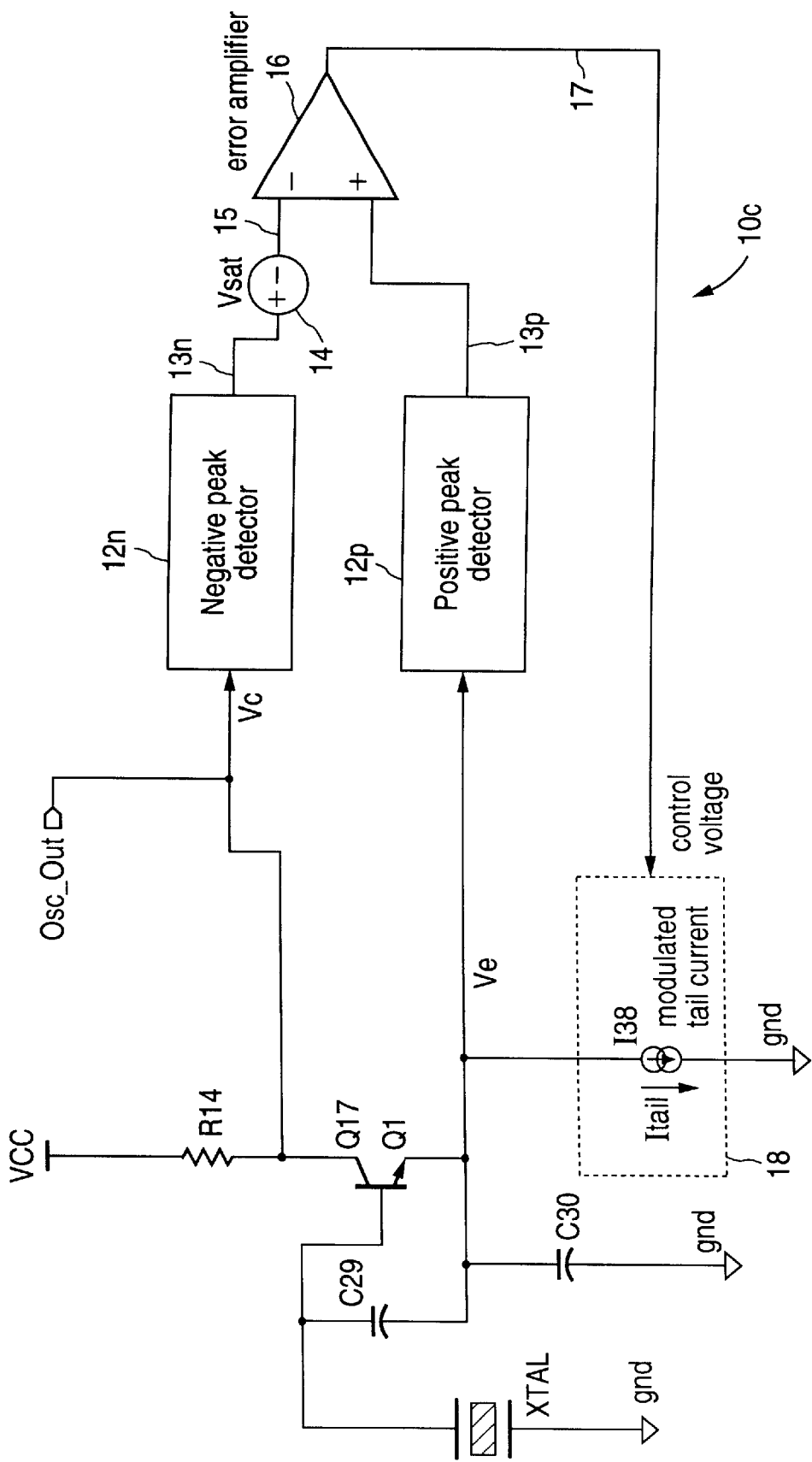
FIG. 4 is a schematic diagram of an alternate embodiment of the circuit of FIG. 3.

Referring to FIG. 4, an alternative embodiment 10*c* of the circuit of FIG. 3 uses a crystal in place of the inductive circuit element L13 (FIG. 3) to establish the oscillation frequency. (Additionally, as is well known in the art, the use of the crystal in place of the inductive element causes the oscillation frequency to be significantly more stable.)

Figure 5:
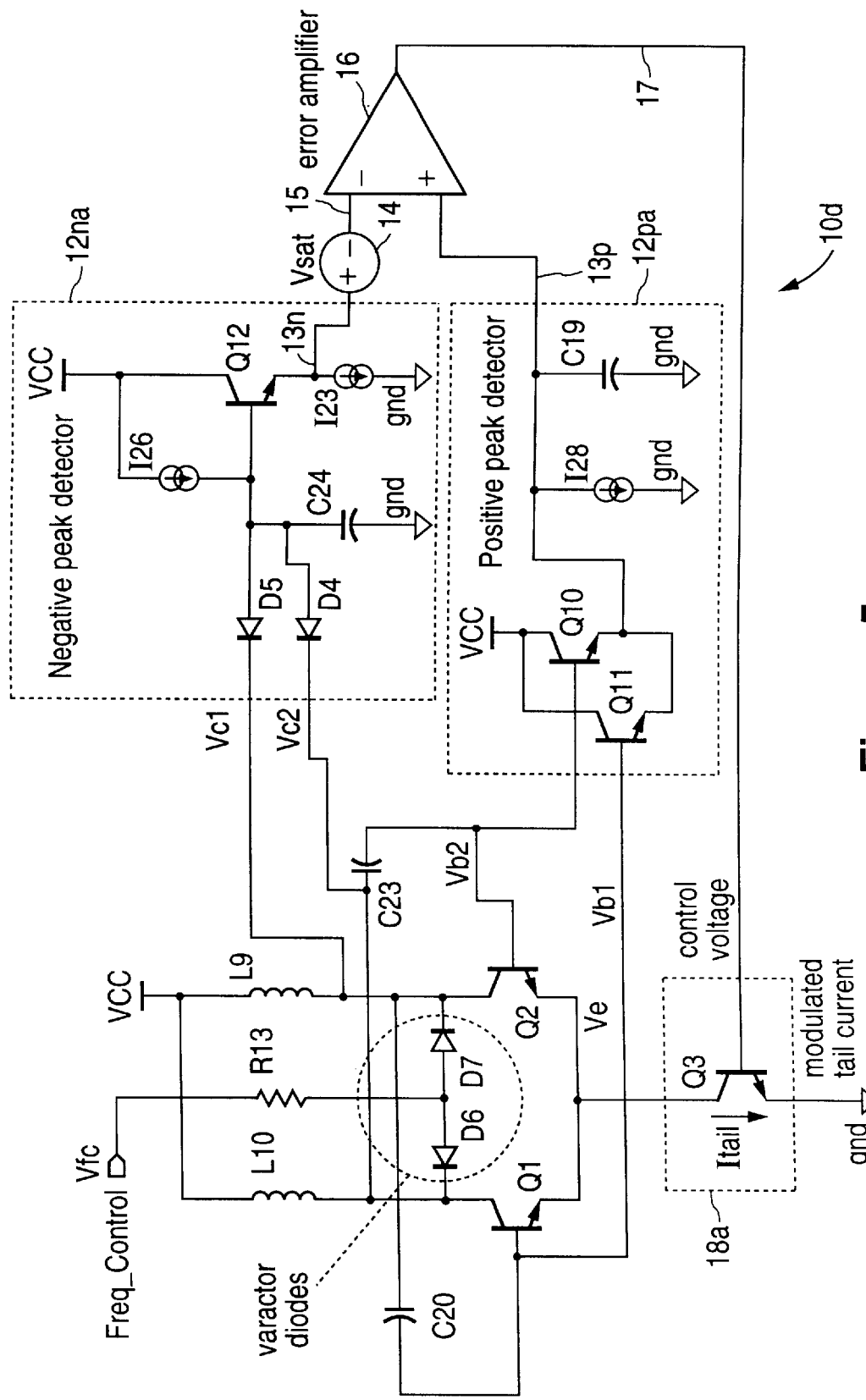
FIG. 5 is a schematic diagram of an alternate embodiment of the circuit of FIG. 2.

Referring to FIG. 5, an alternative embodiment 10*d* of the circuit 10*a* of FIG. 2 has an oscillator circuit whose frequency is controlled by a frequency control voltage Vfc that controls the bias on varactor diodes D6, D7 connected between the collector terminals of the oscillator transistors Q1, Q2. The remaining circuitry operates in accordance with the discussion above concerning FIG. 2.

It should be noted and readily appreciated that although the discussion of the presently claimed invention has been in the context of an oscillation circuit using NPN transistors, the principles discussed herein are also applicable to oscillator circuits implemented with PNP transistors, with appropriate reversals of power supply polarities and connections of the tail current source 18 and reactive circuit elements in accordance with well known circuit design techniques.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an oscillator with an oscillation signal amplitude that is automatically controlled for a selectively minimized oscillation signal phase noise, comprising:

oscillator circuitry including first and second circuit terminals and an active circuit portion coupled between said first and second circuit terminals that, responsive to an amplitude control signal, generates an oscillator signal between said first and second circuit terminals, wherein said first and second circuit terminals are at first and second DC bias potentials, respectively, and said first DC bias potential is higher than said second DC bias potential; and voltage control circuitry, coupled to said oscillator circuitry, that, responsive to a comparison of a minimum signal voltage at said first circuit terminal and a maximum signal voltage at said second circuit terminal, generates said amplitude control signal such that a difference between said minimum and maximum signal voltages is maintained at a predetermined voltage amplitude.

2. The apparatus of claim 1, wherein said active circuit portion comprises a transistor which includes:

a first transistor terminal that is said first circuit terminal and conveys said minimum signal voltage; and a second transistor terminal that is said second circuit terminal and conveys said maximum signal voltage.

3. An apparatus including an oscillator with an oscillation signal amplitude that is automatically controlled for a selectively minimized oscillation signal phase noise, comprising:

oscillator circuitry including first and second circuit terminals and an active circuit portion coupled between said first and second circuit terminals that, responsive to an amplitude control signal, generates an oscillator signal between said first and second circuit terminals, wherein said first and second circuit terminals are at first and second DC bias potentials, respectively, and said first DC bias potential is higher than said second DC bias potential, and wherein said active circuit portion comprises a transistor which includes a first transistor terminal that is said first circuit terminal and conveys said minimum signal voltage, and a second transistor, terminal that is said second circuit terminal and conveys said maximum signal voltage; and voltage control circuitry, coupled to said oscillator circuitry, that, responsive to a comparison of a minimum signal voltage at said first circuit terminal and a maximum signal voltage at said second circuit terminal, generates said amplitude control signal such that a difference between said minimum and maximum signal voltages is maintained at a predetermined voltage amplitude, wherein said predetermined voltage amplitude comprises a saturation voltage for said transistor.

4. The apparatus of claim 2, wherein said oscillator circuitry further comprises current source circuitry, coupled to one of said first and second transistor terminals, that, responsive to said amplitude control signal, controls a current through said transistor.

5. An apparatus including an oscillator with an oscillation signal amplitude that is automatically controlled for a selectively minimized oscillation signal phase noise, comprising:

oscillator circuitry including first and second circuit terminals and an active circuit portion coupled between said first and second circuit terminals that, responsive to an amplitude control signal, generates an oscillator signal between said first and second circuit terminals, wherein said first and second circuit terminals are at first and second DC bias potentials, respectively, and said first DC bias potential is higher than said second DC bias potential; and voltage control circuitry, coupled to said oscillator circuitry, that, responsive to a comparison of a minimum signal voltage at said first circuit terminal and a maximum signal voltage at said second circuit terminal, generates said amplitude control signal such that a difference between said minimum and maximum signal voltages is maintained at a predetermined voltage amplitude, wherein said voltage control circuitry includes first voltage detection circuitry that detects said minimum signal voltage, and second voltage detection circuitry that detects said maximum signal voltage.

6. The apparatus of claim 5, wherein said voltage control circuitry further comprises voltage comparison circuitry, coupled to said first and second voltage detection circuitry, that compares said detected minimum and maximum signal voltages and generates a comparison result signal.

7. The apparatus of claim 6, wherein said voltage control circuitry still further comprises current source circuitry, coupled to said voltage comparison circuitry, that, responsive to said comparison result signal, generates said amplitude control signal.

8. The apparatus of claim 1, wherein said amplitude control signal comprises a control current.

9. The apparatus of claim 1, wherein said amplitude control signal comprises a control voltage.

10. The apparatus of claim 1, further comprising frequency control circuitry, coupled to said oscillator circuitry, that selectively controls a frequency of said oscillator signal.

11. An apparatus including an oscillator with an oscillation signal amplitude that is automatically controlled for a selectively minimized oscillation signal phase noise, comprising:

oscillator means including active circuit means for responding to an amplitude control signal by generating an oscillator signal across said active circuit means; and voltage controller means for responding to a comparison of a minimum signal voltage at a first node of said active circuit means and a maximum signal voltage at a second node of said active circuit means by generating said a amplitude control signal such that a difference between said minimum and maximum signal voltages is maintained at a predetermined voltage amplitude, wherein said first and second nodes are at first and second DC bias potentials, respectively, and said first DC bias potential is higher than said second DC bias potential.

12. The apparatus of claim 11, wherein said oscillator means comprises current source means for responding to said amplitude control signal by controlling a current through said active circuit means.

13. An apparatus including an oscillator with an oscillation signal amplitude that is automatically controlled for a selectively minimized oscillation signal phase noise, comprising:

oscillator means including active circuit means for responding to an amplitude control signal by generating an oscillator signal across said active circuit means; and voltage controller means for responding to a comparison of a minimum signal voltage at a first node of said active circuit means and a maximum signal voltage at a second node of said active circuit means by generating said amplitude control signal such that a difference between said minimum and maximum signal voltages is maintained at a predetermined voltage amplitude, wherein said first and second nodes are at first and second DC bias potentials, respectively, and said first DC bias potential is higher than said second DC bias potential, wherein said voltage controller means includes first voltage detector means for detecting said minimum signal voltage, and second voltage detector means for detecting said maximum signal voltage.

14. The apparatus of claim 13, wherein said voltage controller means further comprises voltage integrator amplifier means for comparing said detected minimum and maximum signal voltages and generating a comparison result signal.

15. The apparatus of claim 14, wherein said voltage controller means still further comprises current source means for responding to said comparison result signal by generating said amplitude control signal.

16. The apparatus of claim 11, further comprising frequency controller means for selectively controlling a frequency of said oscillator signal.

17. A method for generating an oscillation signal amplitude that is automatically controlled for a selectively minimized oscillation signal phase noise, comprising the steps of:

operating an active circuit between first and second circuit terminals, wherein said first and second circuit terminals are at first and second DC bias potentials, respectively, and said first DC bias potential is higher than said. second DC bias potential;

receiving an amplitude control signal;

generating, in response to said amplitude control signal, an oscillator signal with a minimum signal voltage at said first circuit terminal and a maximum signal voltage at said second circuit terminal, wherein a difference between said minimum and maximum signal voltages is maintained at a predetermined voltage amplitude;

comparing said minimum and maximum signal voltages; and generating said amplitude control signal in response to said voltage comparison.

18. The method of claim 17, wherein:

said step of operating an active circuit comprises operating a transistor; and said step of generating said oscillator signal comprises generating said minimum and maximum signal voltages across said transistor, and controlling a current through said transistor such that said difference between said minimum and maximum signal voltages is maintained at said predetermined voltage amplitude.

19. A method for generating an oscillation signal amplitude that is automatically controlled for a selectively minimized oscillation signal phase noise, comprising the steps of:

operating an active circuit between first and second circuit terminals, wherein said first and second circuit terminals are at first and second DC bias potentials, respectively, and said first DC bias potential is higher than said second DC bias potential;

receiving an amplitude control signal;

generating, in response to said amplitude control signal, an oscillator signal with a minimum signal voltage at said first circuit terminal and a maximum signal voltage at said second circuit terminal, wherein a difference between said minimum and maximum signal voltages is maintained at a predetermined voltage amplitude;

comparing said minimum and maximum signal voltages by detecting said minimum signal voltage and detecting said maximum signal voltage; and generating said amplitude control signal in response to said voltage comparison.

20. The method of claim 19, wherein said step of generating said amplitude control signal comprises generating said amplitude control signal based upon a difference between said detected minimum and maximum signal voltages.

* * * * *

UNITED STATES PATENT AND TRADEMARK OFFICE
CERTIFICATE OF CORRECTION

PATENT NO.    : 6,653,908 B1
DATED         : November 25, 2003
INVENTOR(S)   : Jones It is certified that error appears in the above-identified patent and that said Letters Patent is hereby corrected as shown below:

<u>Column 1,</u>
Line 19, please delete "." after "for"

<u>Column 3,</u>
Line 6, please add -- : -- after "of"

<u>Column 4,</u>
Line 60, please delete "th e" and replace with -- the --
Line 62, please delete "." after "it"

<u>Column 5,</u>
Line 23, please delete "128" and replace with -- I28 --

<u>Column 6,</u>
Line 58, please delete "," after "transistor"

<u>Column 7,</u>
Line 61, please delete "a" after "said"

Signed and Sealed this

Ninth Day of March, 2004

JON W. DUDAS
*Acting Director of the United States Patent and Trademark Office*